(12) United States Patent
Fukuro (10) Patent No.: US 7,509,192 B2
(45) Date of Patent: Mar. 24, 2009

(54) IN-VEHICLE MOUNT TYPE AV SYSTEM AND PROGRAM

(75) Inventor: Hideki Fukuro, Anjo (JP)

(73) Assignee: DENSO CORPORATION, Kariya (JP)

( * ) Notice: Subject to any disclaimer, the term of this patent is extended or adjusted under 35 U.S.C. 154(b) by 320 days.

(21) Appl. No.: 11/098,472

(22) Filed: Apr. 5, 2005

(65) Prior Publication Data

US 2005/0222719 A1    Oct. 6, 2005

(30) Foreign Application Priority Data

Apr. 6, 2004    (JP)   ............................ 2004-112256

(51) Int. Cl.
*G06F 17/00* (2006.01)
(52) U.S. Cl. ........................ 701/1; 318/466; 296/37.16; 296/37.15; 296/53; 296/65.01; 345/204; 359/630
(58) Field of Classification Search ..................... 701/1; 345/204; 381/58, 302, 24, 86; 379/420.1, 379/433.02; 318/445, 466; 348/705; 296/37.16, 296/37.15, 53, 65.01; 725/75, 77; 359/630; *G06F 17/00*
See application file for complete search history.

(56) References Cited

U.S. PATENT DOCUMENTS

| | | | | |
|---|---|---|---|---|
| 4,866,776 | A * | 9/1989 | Kasai et al. | 381/302 |
| 4,953,219 | A * | 8/1990 | Kasai et al. | 381/86 |
| 5,040,219 | A * | 8/1991 | Ando et al. | 381/61 |
| 5,040,220 | A * | 8/1991 | Iwamatsu | 381/63 |
| 5,068,897 | A * | 11/1991 | Yamato et al. | 381/302 |
| 5,096,271 | A * | 3/1992 | Portman | 312/7.2 |
| 5,129,004 | A * | 7/1992 | Imai et al. | 381/86 |
| 6,633,286 | B1 * | 10/2003 | Do et al. | 345/205 |
| 6,724,317 | B1 * | 4/2004 | Kitano et al. | 340/691.1 |
| 2001/0022553 | A1 * | 9/2001 | Pala et al. | 340/901 |
| 2002/0110788 | A1 * | 8/2002 | Henry et al. | 434/62 |
| 2003/0125873 | A1 * | 7/2003 | Yamaguchi et al. | 701/211 |
| 2003/0142835 | A1 * | 7/2003 | Enya et al. | 381/86 |

(Continued)

FOREIGN PATENT DOCUMENTS

JP    U-59-009693    1/1984

(Continued)

OTHER PUBLICATIONS

Office Action dated Oct. 28, 2008 in corresponding Japanese patent application No. 2004-112256 (and English translation).

*Primary Examiner*—Tuan C To
(74) *Attorney, Agent, or Firm*—Posz Law Group, PLC (57) ABSTRACT

In an in-vehicle mount type AV system for implementing proper acoustic effect control, a swing angle of a rear monitor is detected by a right and left angle sensor, and respective acoustic effects of four speakers (for example, the volume levels of reproduced sounds) are adjusted. The angle detected by the right and left angle sensor corresponds to the angle of the display face of the rear monitor, and the correlation between the display face and the head position of an occupant (automobile passenger) can be estimated. That is, the probability that the head portion of the occupant exists in a direction to which the display face of the rear monitor is oriented is high, and thus the acoustic effect is controlled so that proper volume balance is established at the occupant position thus estimated.

15 Claims, 4 Drawing Sheets

U.S. PATENT DOCUMENTS

| | | | |
|---|---|---|---|
| 2004/0036769 A1* | 2/2004 | Sadahiro | 348/148 |
| 2004/0170286 A1* | 9/2004 | Durach et al. | 381/71.4 |
| 2004/0172173 A1* | 9/2004 | Goto et al. | 701/1 |
| 2006/0152347 A1* | 7/2006 | Hofbeck et al. | 340/425.5 |

FOREIGN PATENT DOCUMENTS

| | | |
|---|---|---|
| JP | U-61-103254 | 7/1986 |
| JP | 61268534 A * | 11/1986 |
| JP | A-9-83277 | 3/1997 |
| JP | A-2000-125400 | 4/2000 |
| JP | A-2002-240641 | 8/2002 |

\* cited by examiner

IN-VEHICLE MOUNT TYPE AV SYSTEM AND PROGRAM

CROSS REFERENCE TO RELATED APPLICATION

This application is based on and incorporates herein by reference Japanese Patent Application No. 2004-112256 filed on Apr. 6, 2004.

FIELD OF THE INVENTION

The present invention relates to an AV (Audio Visual) system mounted in a vehicle.

BACKGROUND OF THE INVENTION

With respect to volume control of car audio, there is known a technique of controlling volume balance in accordance with the number of occupants in a vehicle and the positions of the occupants (for example, see JP-A-9-83277).

In the technique disclosed in the above publication, the number of occupants and the positions of the occupants are detected on the basis of image recognition and detection of body temperature, and the volume of sounds emitted from plural speakers (for example, every two speakers at each of front and rear seats, totally four speakers) is controlled in accordance with the detection results.

When the method disclosed in the above publication is implemented, an image pickup camera and a processor for executing analysis processing of images picked up by the image pickup camera are needed to detect the occupants on the basis of the image recognition. Furthermore, when the detection of occupants is carried out by the body temperature detection, it is required to provide a temperature sensor at each seat and a processor for executing occupant presence/absence judging processing based on the detected temperature. If such a complicated expensive device is adopted, the detection of occupants is surely performed. However, it would be more preferable to perform suitable volume control with a simpler construction. It is preferable that an acoustic effect which is a broader concept containing volume is set as a control target.

SUMMARY OF THE INVENTION

The present invention has been implemented in view of the foregoing situation, and has an object to provide a technique that can implement suitable acoustic effect control with a simple construction.

In order to attain the above object, an in-vehicle mount type AV system according to the present invention is mounted in a vehicle, and comprises a control unit, plural acoustic output units which can change acoustic effects, and a display unit. Furthermore, the in-vehicle mount type AV system further comprises an angle varying unit for varying an angle of a display face of the display unit, and an angle detecting unit for detecting the angle varied by the angle varying unit. The control unit executes a procedure in which the acoustic effect of each of the plural acoustic output units is controlled on the basis of the varied angle detected by the angle detecting unit. It is considered that at least volume may be controlled as an acoustic effect to be controlled, however, other acoustic effects (for example, addition of reverberation components, correction of acoustic pressure frequency characteristic, etc.) may be added.

The varied angle detected by the angle detecting unit corresponds to the angle of the display face of the display unit, and the correlation between this display face and the head positions of the occupants can be estimated. That is, there is a high probability that the head portions of the occupants exist in the direction along which the display face is oriented. For example, if an occupant exists at one of the right and left seats, the display face is oriented in that direction with high probability. Accordingly, the acoustic effect may be controlled so that a proper sound field is formed at the occupant position thus estimated. A well-known method may be used as the method of controlling the acoustic effect. For example, a map of acoustic effect parameters is prepared in accordance with occupant positions in advance, and the parameters are adjusted by using the map. Of course, even if any occupant does not necessarily exist in the direction along which the display face is oriented, proper control could be finally performed in many cases. For example when occupants are present at both the right and left seats, the display face may be oriented just to the midpoint between the occupants. In this case, although no occupant is actually present, the acoustic effect is controlled so that a proper sound field is formed between both the occupants, the proper sound field is finally formed for both the occupants, and thus a desired sound state can be established.

As described above, the construction itself is simple although the proper acoustic effect control can be implemented. That is, it is originally effective to occupants viewing display contents that the display face angle of the display unit is varied, and it is preferable to implement this construction irrespective of control or non-control of the acoustic effects. Accordingly, if the angle varying unit (for example, motor) described above is provided, the varied angle can be detected by only detecting the rotational angle of the motor, for example, and thus the construction can be made very simple. That is, in the publication described above, an image pickup camera, an image analysis processor, etc. are needed, and a complicated and expensive apparatus is needed. However, in the case of the in-vehicle mount type AV system of the present invention, the proper control of the acoustic effects can be implemented while maintaining a simple and inexpensive configuration. However, the positions of the occupants are estimated from first to last, and the positions of the occupants are not accurately detected unlike the case where the image pickup camera and the image analysis processor are used. However, a sufficient effect can be achieved by using even the occupant detecting method based on the estimation according to the present invention, leading to enhanced effectiveness.

The display unit may be used for front seats or rear seats, and at least a display unit for the rear seats may be targeted. The display unit for the front seats may be targeted. The display unit for the front seats is frequently set so that only the navigation screen is displayed during travel of the vehicle out of consideration to safety. Accordingly, when a user watches AV for a general entertainment, the display for the rear seats is actually more effective. In this sense, the present invention is very effective to a rear entertainment system (a system in which occupants at the rear seats enjoy AV).

It is preferable that the angle varying unit can vary the display face angle of the display unit at least in the right and left direction. When an occupant sits at only one of the right and left seats, the optimum acoustic effect control targeting the occupant concerned can be implemented. Of course, the effect can be achieved even when the display face angle is varied only in the vertical direction. That is, in the case of an adult and a child which are different in seating height, the head positions thereof are different from each other. Accordingly, the acoustic effect may be controlled in accordance with the head positions. However, since the varied angle of the display face is actually larger in the right and left direction than in the vertical direction, and thus it is a more realistic manner to make the display face variable at least in the right and left direction.

As described above, the acoustic effect control is carried out on the basis of the knowledge that the head portions of occupants exist in the orientation (facing) direction of the display face with high probability. If the head positions of the occupants are more accurately estimated, it would be preferable that the seat states are added. That is, the seats of the vehicle are designed so that the tilt angle of each back rest is variable and the positions of the seats are slidable in the front and rear direction. Therefore, if these elements are varied, the head positions of the occupants are varied. Therefore, the system of the present invention is provided with a tilt angle detecting unit for detecting the tilt angle of the back rest of each seat and a front and rear sliding distance detecting unit for detecting the sliding distance from the reference position of the seat in the front and rear direction, and the acoustic effect control may be also executed on the basis of the tilt angle and sliding distance thus detected.

The acoustic effect control may be executed only when the output content from the acoustic output unit and the display content of the display unit are based on the same source. For example, the acoustic effect control is carried out only when a TV broadcast is watched or a AV-set source is reproduced, for example, DVD reproduced music/pictures are listened to/viewed. The present invention relates to the method of estimating the occupant positions on the basis of the orientation of the display face of the display unit. If AVs are based on the same source, occupants who watch the display content of the display unit are subjects who listen to the output content from the acoustic output unit, and thus it is highly reasonable that the acoustic effect control is carried out while targeting these occupants. Of course, if AVs are not based on the same source, it is not meaningless that the acoustic effect control as described above is carried out. For example, there is a realistic case where an occupant who reproduces CD music and listens to the CD music output from the acoustic output unit views an image or the like which is irrelevant to the CD music.

With respect to the angle varying means, only a mechanism for holding the display unit so that the display unit is rotatable is provided, and actually an occupant may manually vary the angle of the display face of the display unit. However, if the display face angle can be varied electrically, it would be convenient for occupants. In this case, the angle varying unit is provided with not only the mechanism for rotatably holding the display unit, but also a motor, for example. When an instruction for varying the display face angle is accepted by an angle varying instruction accepting unit, the control unit may control the angle varying unit so that the angle is varied to an angle corresponding to the varying instruction thus accepted. For example, it would be convenient if the angle variation instruction is accepted by a remote controller or the like.

When the display processing used in the display unit is finished, the control unit may control the angle varying unit so that the display face angle of the display unit is returned to an initial state. For example, if the power supply to the in-vehicle mount type AV system is switched by an accessory switch, the display face angle may be returned to the initial state when the accessory switch is turned off. Of course, there is no critical problem if the display face angle is not returned to the initial state. However, the display face is oriented (deviated) to any one of the right and left seats, so that lopsided acoustic effect control may be carried out. In this case, if the acoustic effect control is finished with being left unbalanced and then the display face angle is oriented to any one of the right and left seats when the accessory switch is turned on, so that lopsided acoustic effect control would be carried out after all. It would be no problem if it is regarded that the above deviation causes the acoustic effect control result. However, if the cause is not known, it may be misunderstood that abnormality occurs in the in-vehicle mount type AV system. Therefore, the returning operation to the initial state prevents occurrence of the misunderstanding described above.

When the control unit of the in-vehicle mount type AV system described above is implemented by a computer, a program to be executed by the computer may be provided. Such a program may be recorded in a computer-readable recording medium such as a flexible disk, an magnetooptical disc, CD-ROM, a storage device, ROM, RAM or the like, and it is loaded and executed by the computer as occasion demands or loaded and executed through a network, whereby the function of the control unit can be implemented.

DETAILED DESCRIPTION OF PREFERRED EMBODIMENTS

Embodiments according to the present invention will be described with reference to the accompanying drawings. The present invention is not limited to the following embodiments, and various modifications may be made without departing from the subject matter of the present invention.

[In-vehicle Mount Type AV System]

Figure 1:
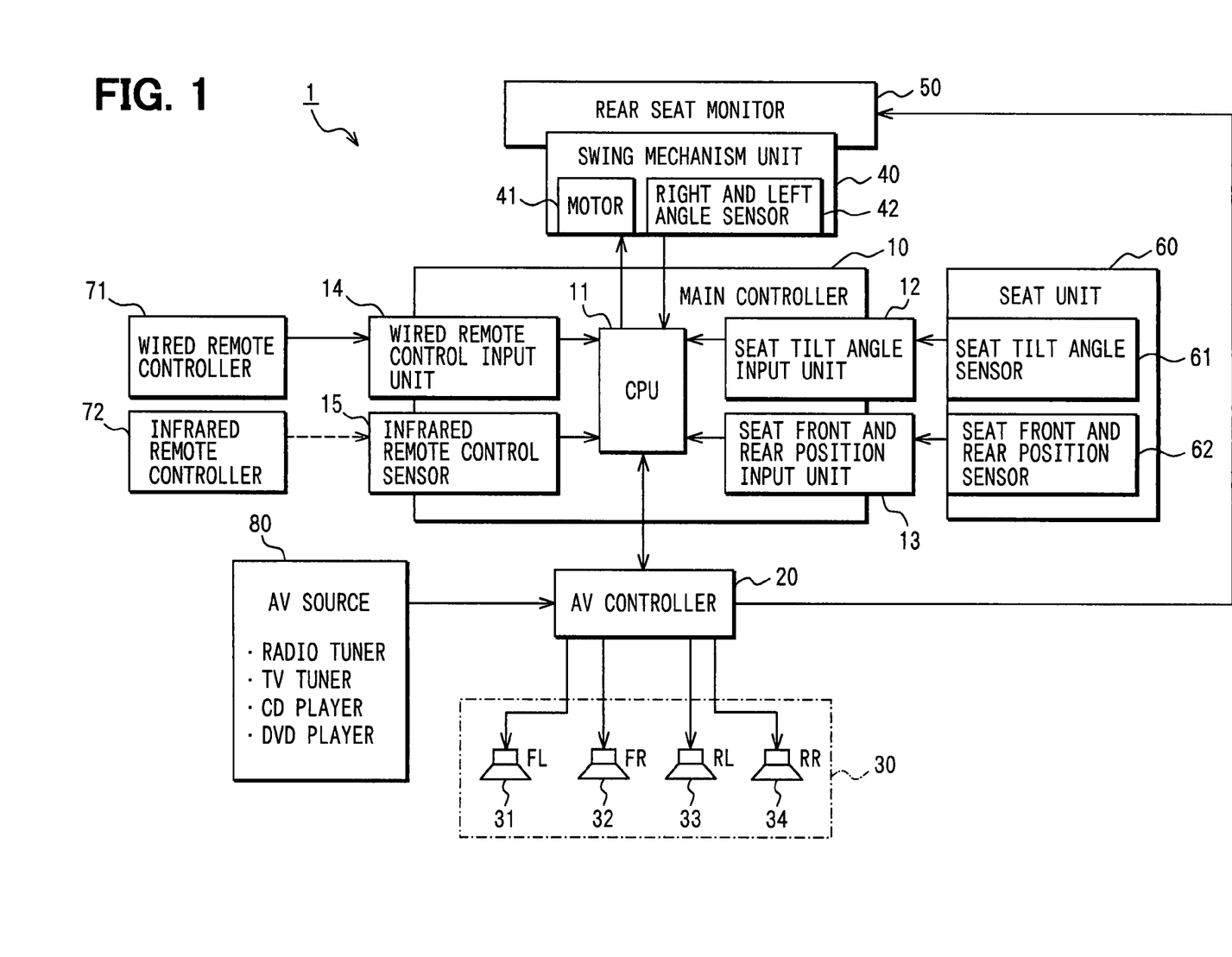
FIG. 1 is a diagram showing the schematic construction of an in-vehicle mount type AV system 1 according to an embodiment.

FIG. 1 is a block diagram showing the construction of an in-vehicle mount type AV system 1 according to an embodiment.

The in-vehicle mount type AV system 1 of this embodiment is mounted in a vehicle, and it comprises a main controller 10, an AV controller 20, a speaker group 30, a swing mechanism unit 40, a rear motor 50, a seat tilt angle sensor 61 and a seat front and rear position sensor 62 which are provided to the seat unit 60, a wired remote controller 71, an infrared remote controller 72 and an AV source 80.

The main controller 10 has a CPU 11, a seat tilt angle input unit 12, a seat front and rear position input unit 13, a wired remote controller input unit 14, and an infrared remote controller sensor 15.

Figure 4A:
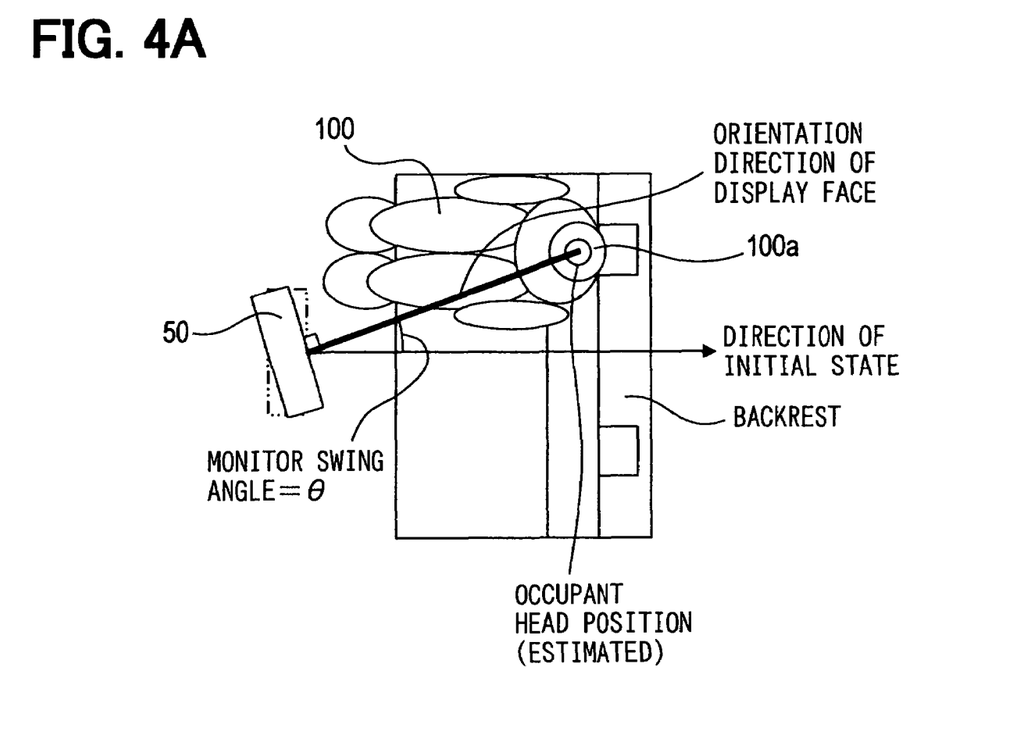
FIGS. 4A and 4B are diagrams showing a monitor swing angle θ, a reference distance L, a seat front and rear moving amount l, a reference seat length S, a seat tilt angle φ, a reference height H, etc.
Figure 4B:
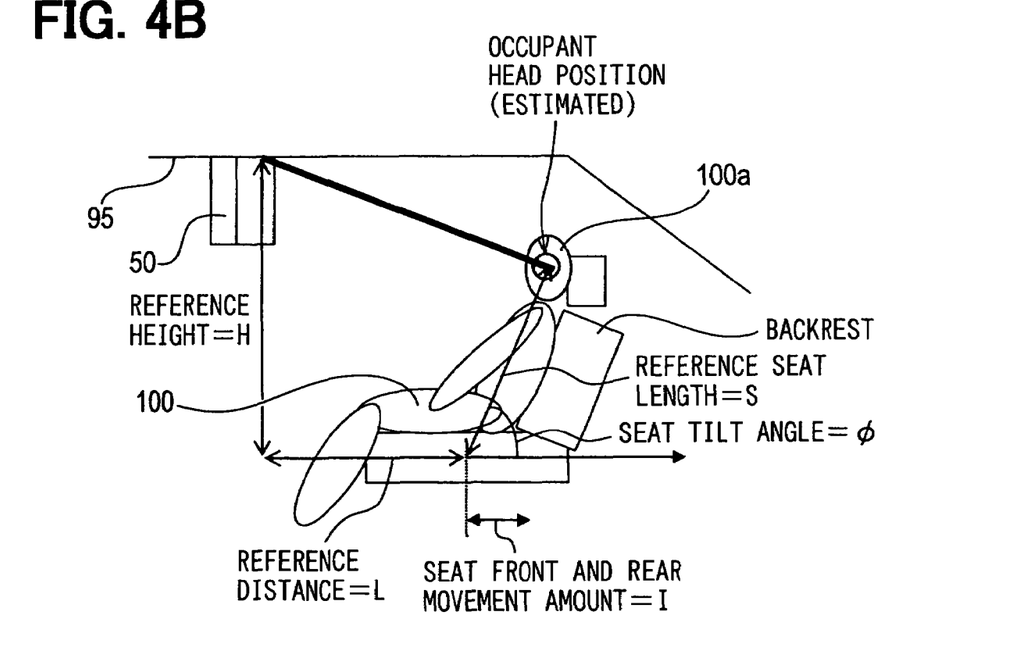

The seat tilt angle input unit 12 inputs a tilt angle φ of a seat from the seat tilt angle sensor 61, and the seat front and rear position input unit 13 inputs a seat front and rear position from the seat front and rear position sensor 62. The seat tilt angle φ means the intersecting angle between the back rest and the horizontal direction as shown in FIG. 4(B). Such an angle may actually be referred to as a rising angle; however, here it will be referred to as a tilt angle because it is used as an angle indicating the degree of which the back rest of the seat unit 60 is tilted. Accordingly, the smaller the seat tilt angle φ, the larger the tilting degree of the back rest. The seat front and rear position means the position of the seat unit 60 in the front and rear direction when a predetermined position is set as a reference. The predetermined reference position may be set to a position at which the seat unit 60 is moved to the forefront side and an occupant sits on the seat. If so, when the occupant uses the seat, the occupant moves the seat unit 60 from the predetermined position to the rear side of the vehicle and uses it there. The seat front and rear moving amount l shown in FIG. 4B can be calculated on the basis of the information of the position after the movement and the predetermined reference position.

The wired remote control input unit 14 inputs a signal from the wired remote controller 71, and the infrared remote control sensor 15 inputs a signal from the infrared remote controller 72. In this embodiment, the remote control operating equipment as described above are provided. However, an operating panel having switches, etc. may be used in place of the above remote control operating equipment or used in combination with remote control equipment.

Figure 2:
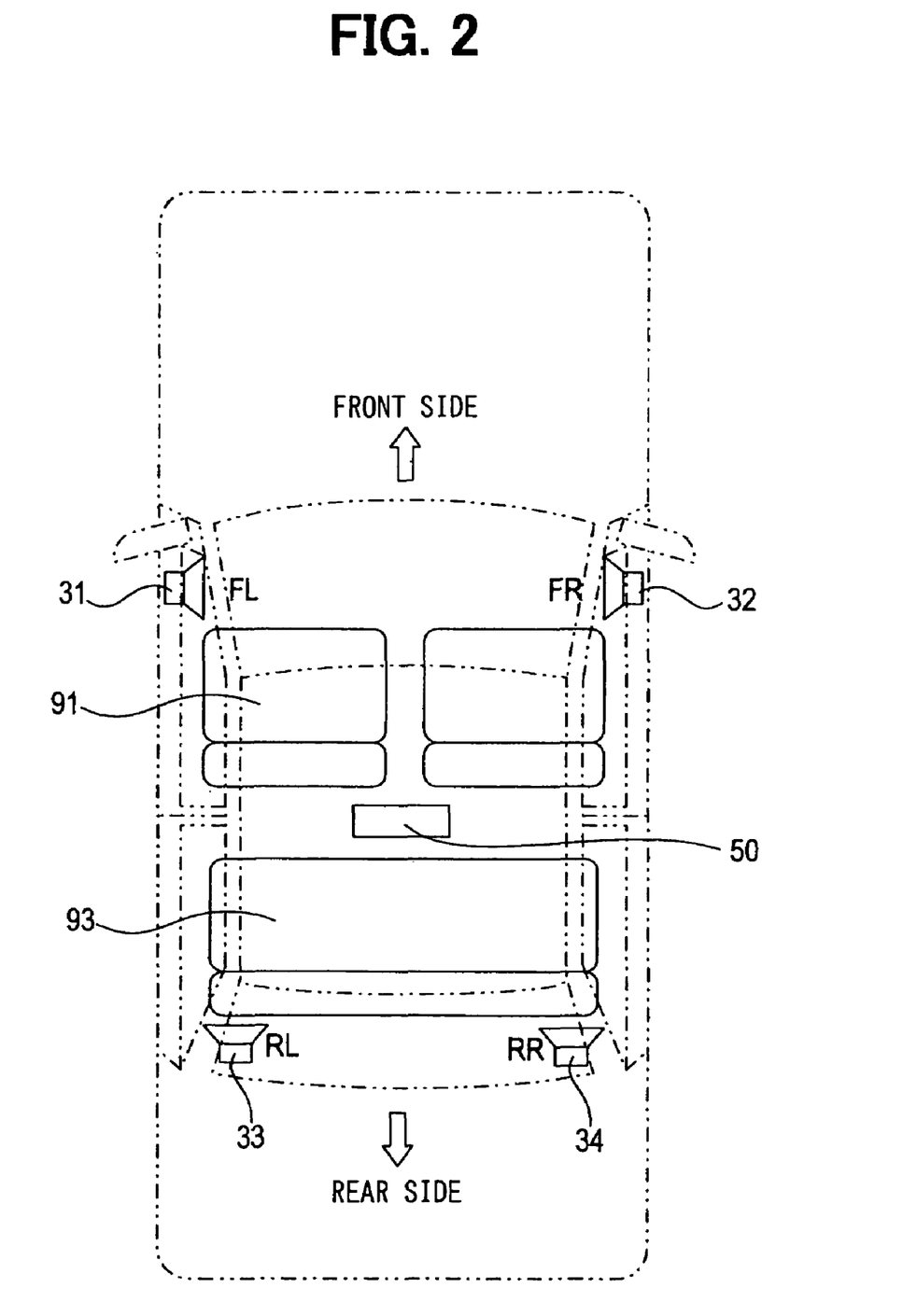
FIG. 2 is a diagram showing an arrangement of speakers 31 to 34 and a rear monitor 50 in a vehicle.

The speaker group 30 contains plural speakers for outputting acoustic signals of the respective channels forming a sound field of multichannel surround. For example, as shown in FIG. 2, they comprise an FL (Front Left) speaker 31 disposed at the left side of the front seats 91, an FR (Front Right) speaker 32 disposed at the right side of the front seats 91, an RL (Rear Left) speaker 33 disposed at the left rear side of the rear seat 93 and an RR (Rear Right) speaker 34 disposed at the right rear side of the rear seat 93. In this embodiment, as shown in FIG. 2, the two speakers 31 and 32 disposed at the right and left sides of the front seats 91 are disposed on the doors or the like constituting the side walls of the front right and left sides of the vehicle room, and the two speakers 33, 34 disposed at the rear right and left sides of the rear seat 93 are disposed at the right and left sides on the rear tray. The positions of these speakers are not limited to the above positions. For example, the FL speaker 31 and the FR speaker 32 may not be disposed on the front side walls of the vehicle room, but disposed on the front console panel. Furthermore, the RL speaker 33 and the RR speaker 34 may not be disposed on the rear tray, but disposed on the rear side walls of the vehicle room. In this embodiment, the speaker group 30 is constructed by the four speakers 31 to 34 as shown in FIG. 2. However, various variations may be adopted for the number of the speakers and the arrangement positions of the speakers, and for example, a speaker may be provided at at least one of the front center and the rear center in the vehicle.

The AV controller 20 is connected to the AV source 80, the speaker group 30 and the rear monitor 50. It outputs audio signals input from the AV source 80 to the speaker group 30, and outputs visual signals input from the AV source 80 to the rear monitor 50. The AV source 80 may be considered various kinds of AV equipment such as a radio tuner, a TV tuner, a CD player, a DVD player or the like. The AV controller 20 has DSP (digital signal processor), and executes adjustment control of various kinds of acoustic effects such as the volume level, acoustic pressure frequency characteristic, reverberation characteristic, etc. of reproduced sounds output from the respective speakers 31 to 34. Furthermore, it executes various kinds of control on pictures displayed on the rear monitor 50.

The swing mechanism unit 40 has a motor 41 and a right and left angle sensor 42, and holds the rear monitor 50 so that the rear monitor 50 can be swung in the right and left direction. When the motor 41 is driven on the basis of an instruction from CPU 11 of the main controller 10, the rear monitor 50 is allowed to swing. The right and left swing angle of the rear monitor 50 detected by the right and left angle sensor 42 is output to the main controller 10.

The rear monitor 50 is disposed at the center in the vehicle width direction and between the front seats 91 and rear seat 93 as shown in FIG. 2. More specifically, as shown in FIG. 4B, the monitor 50 is suspended from the ceiling 95, and swingable in the right and left direction while suspended. Furthermore, as shown in FIG. 4A, the display face of the rear monitor 50 is oriented in the backward direction under the initial state, and the swing angle from this initial state in the right and left direction is represented by θ.

A user can give various instructions to the in-vehicle mount type AV system 1 by operating the wired remote controller 71 or the infrared remote controller 72. For example, the user may give an instruction of selecting a desired source from the AV source 80 as described above, an instruction of selecting a channel when the source is a radio tuner or TV tuner and an instruction of reproduction/stop when the source is a CD player or DVD player. With respect to the right and left swing motion of the rear monitor 50, it can be implemented by operating the wired remote controller 71 or the infrared remote controller 72. In this case, after the mode is switched to the swing mode, a predetermined button is continued to be pressed so that the swing motion in the right and left direction is continuously carried out, and the swing motion is stopped at the time point when the button is not pressed, so that the rear monitor 50 is oriented in a desired direction.

[Acoustic Effect Control in In-Vehicle Mount Type AV System]

In the in-vehicle mount type AV system 1 according to this embodiment which is constructed as described above, the swing angle of the rear monitor 50 is detected by the right and left angle sensor 42, and the acoustic effects of the respective four speakers 31 to 34 are controlled on the basis of the detected angle. The acoustic effect to be controlled includes at least the volume; however, other acoustic effects (for example, the acoustic pressure frequency characteristic, the reverberation characteristic, etc.) may be added. The angle detected by the right and left angle sensor 42 corresponds to the angle of the display face of the rear monitor 50, and the correlation between the display face and the head position of an occupant (automobile passenger) can be estimated. That is, as shown in FIGS. 4A-4B, the probability that the head portion 100a of an occupant 100 exists in the direction along which the display face of the rear monitor 50 is oriented is high. For example, in the case of FIG. 4A, the occupant 100 exists at only the rear right seat, and the probability that the display face of the rear monitor 50 is oriented to the occupant 100 concerned is high.

Accordingly, the acoustic effect may be controlled so that a proper acoustic field is formed at the occupant's position thus estimated. Of course, there are many cases where the proper control of the acoustic effect is finally implemented even if no occupant exists in the orientation direction of the display face. For example, when occupants exist at both the right and left seats, it may be considered that the display face is oriented to the midpoint between both the occupants. In this case, if the acoustic effect is controlled so that the proper acoustic field is formed between both the occupants, although no occupant actually exists there, the proper field could be finally formed for both the two occupants, and thus a desired state can be established.

Figure 3:
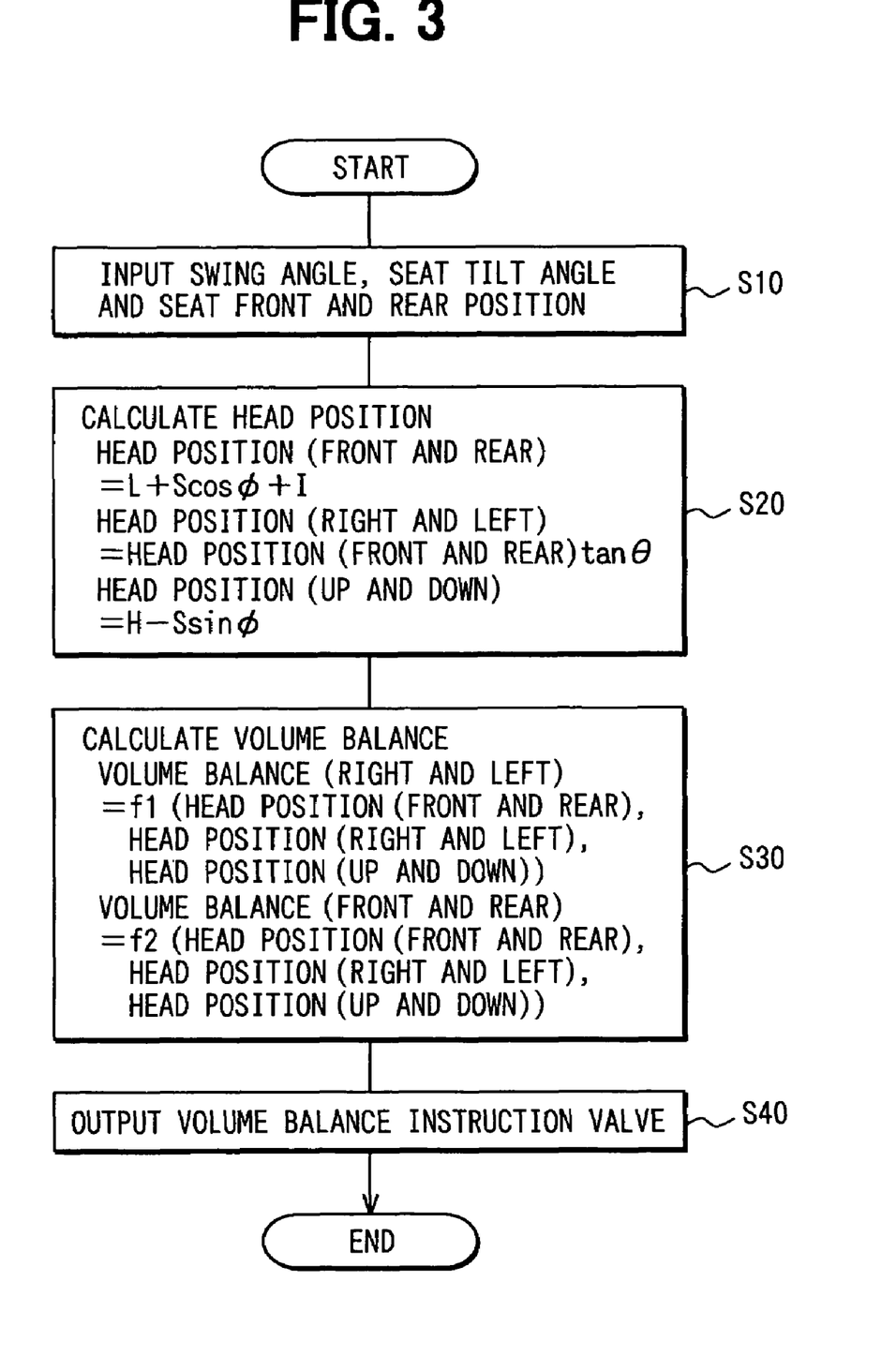
FIG. 3 is a flowchart showing the processing relating to acoustic effect control.

The processing of the acoustic effect control executed by CPU 11 will be described with reference to the flowchart of FIG. 3.

First, the swing angle θ, the seat tilt angle φ and the seat front and rear position are input from the right and left angle sensor 42, the seat tilt angle sensor 61 and the seat front and rear position sensor 62 respectively (S10).

Next, the position of the head portion 100*a* (see FIG. 4) of the occupant 100 (hereinafter referred to as "head position") is calculated (S20). This head position is represented by the three-dimensional orthogonal coordinate system defined in the front and rear/right and left/up and down directions of the vehicle while the position at which the rear monitor 50 is disposed is set as a reference (original point), and the following calculation equation is achieved.

Head position (front and rear direction)=$L+S \times \cos \phi + l$

Head position (right and left direction)=head position (front and rear direction)×tan θ

Head position (up and down direction)=$H-S \times \sin \phi$

The respective symbols in the calculation equation are shown in FIGS. 4A-4B, and the means thereof will be complemented as follows. L represents a reference distance, and specifically it represents the distance between the reference position of the seat unit 60 and the position in the front and rear direction of the rear monitor 50. S represents the reference seat length, and specifically it represents the length which is set with the length of the back rest of the seat unit 60 set as a reference. The seating height of the occupant (automobile passenger) has some width and thus it is not unique. Accordingly, an occupant having a standard body type is assumed, and the reference seat length S may be set on the basis of the seating height of the occupant concerned. Furthermore, l represents the movement amount in the front and rear direction, and specifically it is achieved by calculating the difference between the seat front and rear position input from the seat front and rear position sensor 62 and the reference position of the seat unit 60 by CPU 11. H represents the reference height, and specifically it represents how far the reference position of the seat unit 60 and the position of the rear monitor 50 are from each other in the vertical direction.

When the respective head positions in the front and rear direction, the right and left direction and the up and down direction are calculated in S20, the volume balance is calculated in the following step S30. The volume balance can be achieved on the basis of the following calculation equations for the right and left direction and the front and rear direction.

Volume balance (right and left direction)=f1(head position (front and rear direction), head position (right and left direction), head position (up and down direction))

Volume balance (front and rear direction)=f2(head position (front and rear direction), head position (right and left direction), head position (up and down direction))

Here, the detailed contents of the functions f1, f2 are not described, however, a well-known method may be used. For example, a map of acoustic effect parameters (in this case, parameters of volume) corresponding to occupants' positions is prepared in advance, and the parameters are adjusted by using the map.

When the volume balance is calculated in S30, the volume balance instruction value is output to the AV controller 20 in the following step S40. In the AV controller 20, the volume levels of the reproduced sounds from the FL speaker 31, the FR speaker 32, the RL speaker 33 and the RR speaker 34 are controlled on the basis of the volume balance instruction value input from CPU 11. In the foregoing description, only the control of the volume level was described. However, various kinds of acoustic effects such as the acoustic pressure frequency characteristic, the reverberation characteristic, etc. may be considered as control targets.

{Effect of In-vehicle Mount Type AV System 1 of Embodiment}

As described above, according to the in-vehicle mount type AV system 1 of this embodiment, in view of the technical idea that the correlation between the display face angle of the rear monitor 50 and the head position of the occupant (automobile passenger) can be estimated, the volume levels of the reproduced sounds output from the four speakers 31 to 34 are adjusted on the basis of the swing angle of the rear monitor 50 to establish a proper volume balance for the occupant. As described above, the construction itself can be simplified while the acoustic effect control can be properly implemented. That is, it is originally convenient for occupants watching the display contents of the rear monitor 50 to make the display face angle of the rear monitor 50 variable, and this is favorably implemented irrespective of whether the acoustic effect should be controlled or not. The right and left angle sensor 42 may detect only the rotational angle of the motor 41 for varying the angle of the display face, and thus the construction is very simple.

In the case of FIG. 4A, the occupant 100 exists at only the rear right seat, and thus the probability that the occupant 100 exists in the direction to which the display face of the rear monitor 50 is oriented is high. Accordingly, the acoustic effect is controlled so that the proper acoustic field is formed at the estimated position of the occupant. However, even if an occupant is not present in the direction to which the display face of the rear monitor 50 is oriented, proper control can be finally implemented in many cases. For example, when an occupant further exists at the left seat under the state shown in FIG. 4A, the display face of the rear monitor 50 may be oriented to the midpoint between both the right and left occupants. In this case, no occupant is actually present in the orientation direction of the display face; however, if the proper acoustic field is formed between both the occupants, the proper acoustic field is finally formed for the two occupants, and thus a desired state can be established.

Other Embodiments (1) In the above embodiment, the description has been made on the assumption that the rear monitor 50 for the rear seat is provided. However, the same control may be executed on the basis of the swing angle of the monitor for the front seats. However, the monitor for the front seats is frequently set so that only a navigation screen is displayed during travel of the vehicle in consideration of safety. Accordingly, when general entertainment AV is watched, the rear monitor 50 is actually more effective as the above embodiment shows.

(2) In the above embodiment, the swing mechanism unit 40 holds the rear monitor 50 so that the rear monitor 50 is swingable in the right and left direction. However, the swing mechanism unit 40 may hold the rear monitor 50 so that the rear monitor 50 is swingable only in the up and down direction or in the up and down and right and left directions. However, the swing angle in the right and left direction corresponds to the seat position while the swing angle in the up and down direction corresponds to the difference between the body types of the occupants, and thus the swing angle in the right and left direction may be larger than the swing angle in the up and down direction. Accordingly, a higher effect can be achieved for the swing motion in the right and left direction as described in the above embodiment. However, an effect is achieved even when it is possible to vary the swing angle only in the up and down direction. That is, when the occupants are an adult and a child who are different in seating height, the head positions (that is, height) thereof are different. Accordingly, it is one proper acoustic effect control to control the acoustic effect in accordance with the head position.

(3) In the above embodiment, the similarities between the content displayed on the rear monitor 50 and the content output from the speaker group 30 is not considered. However, the processing shown in FIG. 3 may be executed only when both the contents are the same. In this case, the acoustic effect is controlled only when an AV-set source is reproduced like a case where TV broadcast is watched by a TV tuner in the AV source 80 or a case where reproduced pictures and music are watched/listened to by a DVD player. The occupant position is estimated on the basis of the orientation of the display face of the rear monitor 50. Therefore, if Avs are based on the same source, an occupant who watches a display content on the rear monitor 50 is a subject who listens to an output content from the speaker group 30, and thus it is highly reasonable that the acoustic effect is controlled with such an occupant as a target.

Even when the content displayed on the rear monitor 50 is not the same as the content output from the speaker group 30, it is significant to execute the acoustic effect control in conformity with the swing angle of the rear monitor 50. For example when music is reproduced by a CD player and output from the speaker group 30, there is a realistic case that an occupant who listens to the CD music watches from the rear monitor 50 pictures or the like which are not relevant to the CD music.

(4) As not described in the above embodiment, when the in-vehicle mount type AV system is supplied with power from an in-vehicle mount type battery through an accessory switch to be driven, the following control may be carried out at the time point when the accessory switch is turned off. That is, even when the display face of the rear monitor 50 is set to any swing angle, CPU 11 controls the swing mechanism unit 40 to return the rear monitor 50 to the swing direction of the initial state. There is not a problem if the rear monitor 50 is not returned to the initial state; however, the following disadvantage is considered. That is, it is assumed that the display face of the rear monitor 50 is oriented to the right seat side as shown in FIG. 4A and thus lopsided acoustic effect control is carried out. When the rear monitor 50 is turned off under the above state and then the accessory switch is turned on again, so that the display face of the rear monitor 50 is still oriented to the right seat side, deviated acoustic effect control is necessarily carried out. In this case, if an occupant is present only at the left seat, the proper acoustic effect control is not carried out for the occupant concerned, and also the acoustic effect control at this time is deviated in the opposite direction from the initial state. It would be no problem if it is regarded that the acoustic effect control result is caused by the above deviation. However, if the cause is not known, it may be misunderstood that abnormality occurs in the in-vehicle mount type AV system. Therefore, the returning operation to the initial state prevents occurrence of the misunderstanding described above.

Regarding the appending claims, a control unit may be constituted by the CPU 11 and AV controller 20. Plural acoustic output units which can change acoustic effects may be constituted by the speaker group 30. A display unit may be constituted by the rear monitor 50. The angle varying unit for varying an angle of a display face of the display unit may be constituted by a motor 41 for a swinging mechanism unit 40. The angle detecting unit for detecting the angle varied by the angle varying unit may be constituted by a right and left angle sensor 42.

The tilt angle detecting unit for detecting the tilt angle of the back rest of each seat may be constituted by the seat tilt angle sensor 61. The front and rear sliding distance detecting unit for detecting the sliding distance from the reference position of the seat in the front and rear direction may be constituted by the seat front and rear position sensor 62. The displacement detecting unit may be constituted by one of or both of the seat tilt angle sensor 61 or the seat front and rear position sensor 62. The angle varying instruction accepting unit may be constituted by the wired remote control input unit 14 receiving a signal from the wired remote controller 71, and/or the infrared remote control sensor 15 receiving a signal from the infrared remote controller 72. However, the appended claims are not limited to the above description and the embodiments shown in the drawings, and may be modified or expanded consistent therewith.

What is claimed is:

1. An in-vehicle mount type AV system which is mounted in a vehicle and comprises a control unit, plural acoustic output units whose acoustic effects are variable, and a display unit, characterized by comprising:
    an angle varying unit for varying an angle of a display face of the display unit;
    an angle detecting unit for detecting the angle varied by the angle varying unit, wherein the control unit controls the acoustic effects of the respective plural acoustic output units on the basis of the varied angle detected by the angle detecting unit;
    a tilt angle detecting unit for detecting a tilt angle of a backrest of a seat; and
    a front and rear movement distance detecting unit configured to detect the movement distance in a front and rear direction from a reference position of the seat, wherein the control unit executes the acoustic effect control on the basis of the tilt angle detected by the tilt angle detecting unit and the movement distance detected by the movement distance detecting unit.

2. The in-vehicle mount type AV system according to claim 1, wherein the control unit controls at least a volume as one of the acoustic effects.

3. The in-vehicle mount type AV system according to claim 1, wherein the display unit is provided for at least a rear seat.

4. The in-vehicle mount type AV system according to claim 1, wherein the angle varying unit can vary the display face angle of the display unit at least in the right and left direction.

5. The in-vehicle mount type AV system according to claim 1, wherein the control unit executes the acoustic effect control only when output contents from the acoustic output units and display contents of the display unit are based on the same source.

6. The in-vehicle mount type AV system according to claim 1, wherein the control unit is implemented by a computer program installed and operated on the control unit.

7. An in-vehicle mount type AV system which is mounted in a vehicle and comprises a control unit, plural acoustic output units whose acoustic effects are variable, and a display unit, characterized by comprising:
    an angle varying unit for varying an angle of a display face of the display unit;
    an angle detecting unit for detecting the angle varied by the angle varying unit, wherein the control unit controls the acoustic effects of the respective plural acoustic output units on the basis of the varied angle detected by the angle detecting unit;

an angle varying instruction accepting unit for accepting an instruction of varying the display face angle of the display unit, wherein the control unit controls the angle varying unit so that the display face angle is set to the angle corresponding to the varying instruction accepted by the angle varying instruction accepting unit;

a tilt angle detecting unit for detecting a tilt angle of a backrest of a seat and a front and rear movement distance detecting unit configured to detect the movement distance in a front and rear direction from a reference position of the seat, wherein the control unit executes the acoustic effect control on the basis of the tilt angle detected by the tilt angle detecting unit and the movement distance detected by the movement distance detecting unit.

8. The in-vehicle mount type AV system according to claim 7, wherein the control unit controls the angle varying unit so that the display face angle of the display unit is returned to an initial state when display processing used in the display unit is finished.

9. The in-vehicle mount type AV system according to claim 7, wherein the control unit controls at least a volume as one of the acoustic effects.

10. The in-vehicle mount type AV system according to claim 7, wherein the display unit is provided for at least a rear seat.

11. The in-vehicle mount type AV system according to claim 7, wherein the angle varying unit can vary the display face angle of the display unit at least in the right and left direction.

12. The in-vehicle mount type AV system according to claim 7, wherein the control unit executes the acoustic effect control only when output contents from the acoustic output units and display contents of the display unit are based on the same source.

13. The in-vehicle mount type AV system according to claim 7, wherein the control unit is implemented by a computer program installed and operated on the control unit.

14. A control unit for providing acoustic control of in-vehicle mount type AV system that includes an a display unit having varying angle display capability, the control unit comprising:

an angle detecting unit for detecting an angle of display of the display unit;

a displacement detecting unit for detecting a displacement of a seat, wherein
the control unit determines optimum acoustic control based on the displacement detected by the displacement detecting unit based on the varied angle detected by the angle detecting unit;

a tilt angle detecting unit for detecting a tilt angle of a backrest of a seat;

a front and rear movement distance detecting unit configured to detect the movement distance in a front and rear direction from a reference position of the seat, wherein the control unit executes the acoustic effect control on the basis of the tilt angle detected by the tilt angle detecting unit and the movement distance detected by the movement distance detecting unit; and an angle varying instruction accepting unit for accepting an instruction of varying the display face angle of the display unit, wherein the control unit controls the angle varying unit so that the display face angle is set to the angle corresponding to the varying instruction accepted by the angle varying instruction accepting unit.

15. The in-vehicle mount type AV system according to claim 14, wherein the control unit controls the angle varying unit so that the display face angle of the display unit is returned to an initial state when display processing used in the display unit is finished.

* * * * *